United States Patent
Murakami

(10) Patent No.: US 6,363,847 B1
(45) Date of Patent: Apr. 2, 2002

(54) METHOD OF APPLYING ADHESIVE MATERIAL TO PARTS MOUNTED CIRCUIT BOARD

(75) Inventor: Takehiko Murakami, Inagi (JP)

(73) Assignee: Minami Co., Ltd., Tokyo (JP)

( * ) Notice: Subject to any disclaimer, the term of this patent is extended or adjusted under 35 U.S.C. 154(b) by 0 days.

(21) Appl. No.: 09/609,614

(22) Filed: Jul. 5, 2000

(30) Foreign Application Priority Data

Aug. 27, 1999 (JP) .......................................... 11-240865

(51) Int. Cl.[7] .............................................. B41M 1/12
(52) U.S. Cl. ........................ 101/129; 101/127; 118/213; 427/282
(58) Field of Search ................................ 101/123, 127, 101/127.1, 128.4, 128.21, 129; 427/96, 97, 282, 404, 409; 118/213, 406

(56) References Cited

U.S. PATENT DOCUMENTS

| | | | | |
|---|---|---|---|---|
| 4,678,531 A | * | 7/1987 | Metzger et al. ............. | 156/250 |
| 5,368,883 A | * | 11/1994 | Beaver ......................... | 427/96 |
| 5,373,786 A | * | 12/1994 | Umaba ......................... | 101/127 |
| 5,704,287 A | * | 1/1998 | Omori et al. ............. | 101/128.4 |
| 5,740,730 A | * | 4/1998 | Thompson, Sr. ............. | 101/127 |
| 6,272,984 B1 | * | 8/2001 | Kato et al. ................... | 101/129 |

* cited by examiner

*Primary Examiner*—Ren Yan
(74) *Attorney, Agent, or Firm*—R. Neil Sudol; Henry D. Coleman; William J. Sapone

(57) ABSTRACT

The invention greatly improves an efficiency of a whole of aparts mounting process. In a method of applying an adhesive material to a parts mounted circuit board, a recess portion surrounding a part of a circuit board in which the parts are already mounted is provided on a back surface, a portion corresponding to a position at which the parts of the circuit board should be mounted is protruded in the recess portion, and a mask having a through hole for applying the adhesive material in the protruding portion is used. Then, the mask is mounted on the circuit board and the adhesive material is pressed out from a through hole by a squeegee in a screen printing apparatus so as to be applied.

7 Claims, 5 Drawing Sheets

METHOD OF APPLYING ADHESIVE MATERIAL TO PARTS MOUNTED CIRCUIT BOARD

BACKGROUND OF THE INVENTION

1. Field of the Invention

The present invention relates to a method of applying an adhesive material to a parts mounted circuit board.

2. Description of the Prior Art

Parts are sometimes mounted on a printed circuit board at several times. When mounting next parts on the mounted circuit board, an adhesive material is applied to a position at which the next parts are mounted, however, this application has been conventionally performed one by one by a manual operation. Further, it is a significantly difficult operation to apply the adhesive material in a spot manner between the mounted parts. Accordingly, the applying operation is troublesome, thereby deteriorating an efficiency of a whole of the mounting process.

SUMMARY OF THE INVENTION

The present invention is made by taking the points mentioned above into consideration, and an object of the present invention is to provide a method of applying an adhesive material to a parts mounted circuit board in which an application of an adhesive material is performed by printing so as to apply the adhesive material to a large number of parts mounted circuit plate at one time, solve a troublesomeness in the case of manually applying in a spot manner and greatly improve an efficiency of a whole of the mounting process.

Therefore, in accordance with the present invention, there is provided a method of applying an adhesive material to a parts mounted circuit board, wherein a recess portion surrounding a part of a circuit board in which the parts are already mounted is provided on a back surface, a portion corresponding to a position at which the parts of the circuit board should be mounted is protruded in the recess portion, a mask having a through hole for applying the adhesive material in the protruding portion is used, and the adhesive material is applied by screen printing.

DESCRIPTION OF THE PREFERRED EMBODIMENT

A description will be given below of an embodiment in accordance with the present invention with reference to the accompanying drawings.

Figure 1:
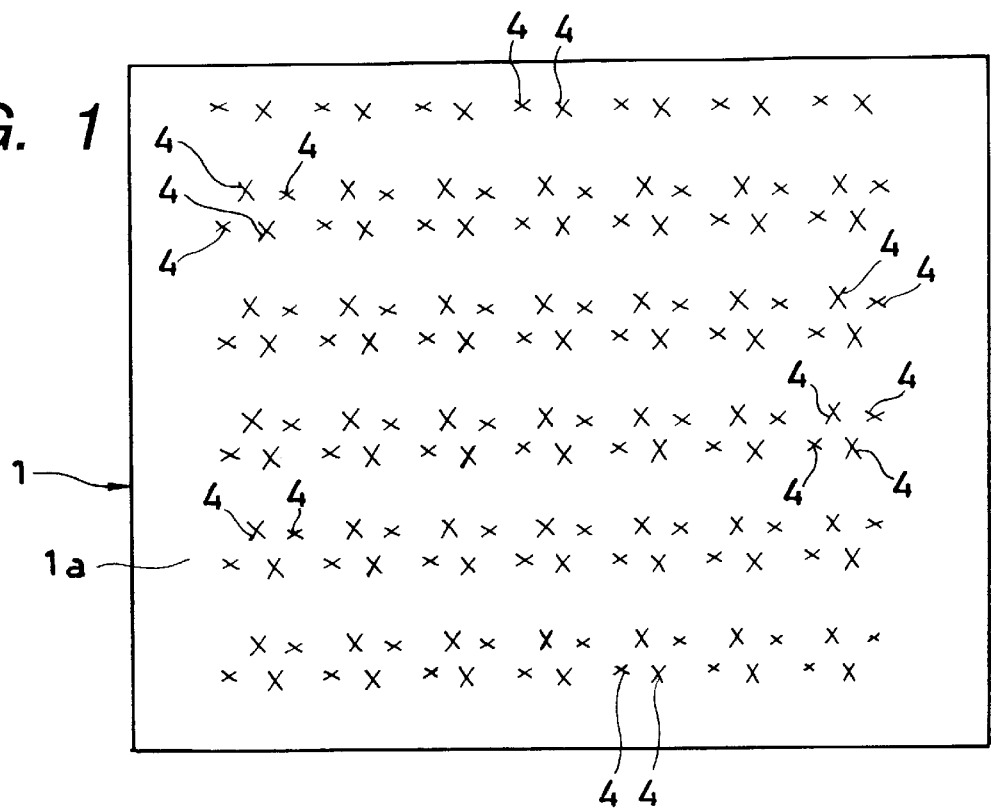
FIG. 1 is a schematic view of a front surface of a mask used in the present invention.
Figure 2:
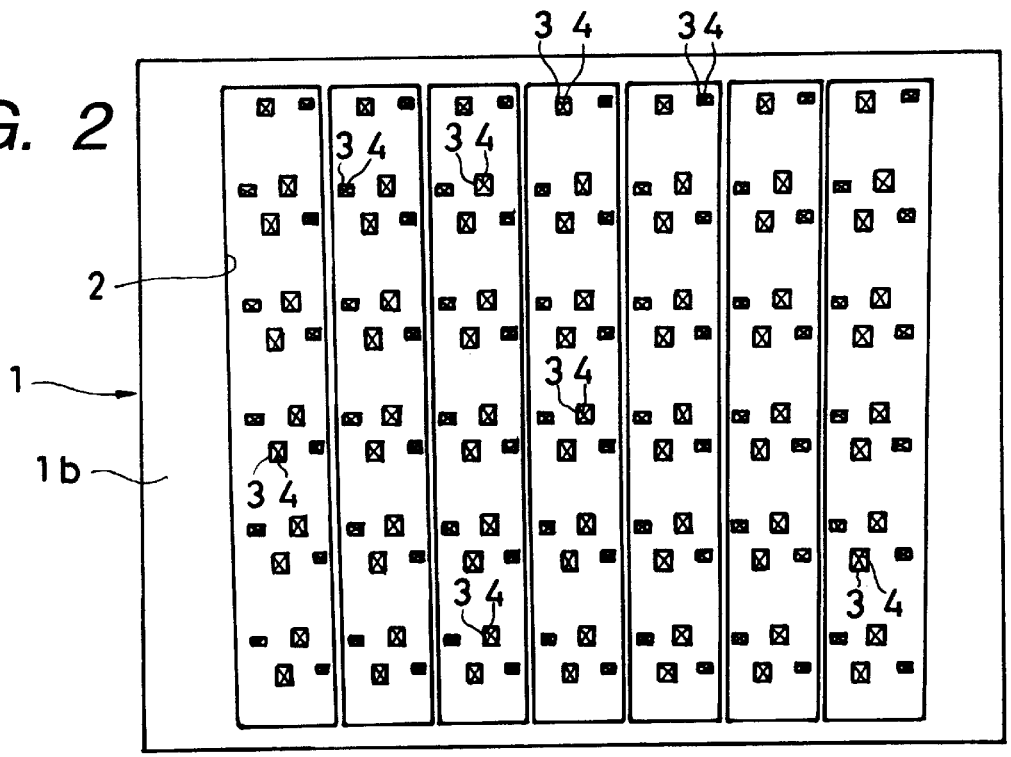
FIG. 2 is a schematic view of a back surface of the mask used in the present invention.
Figure 3:
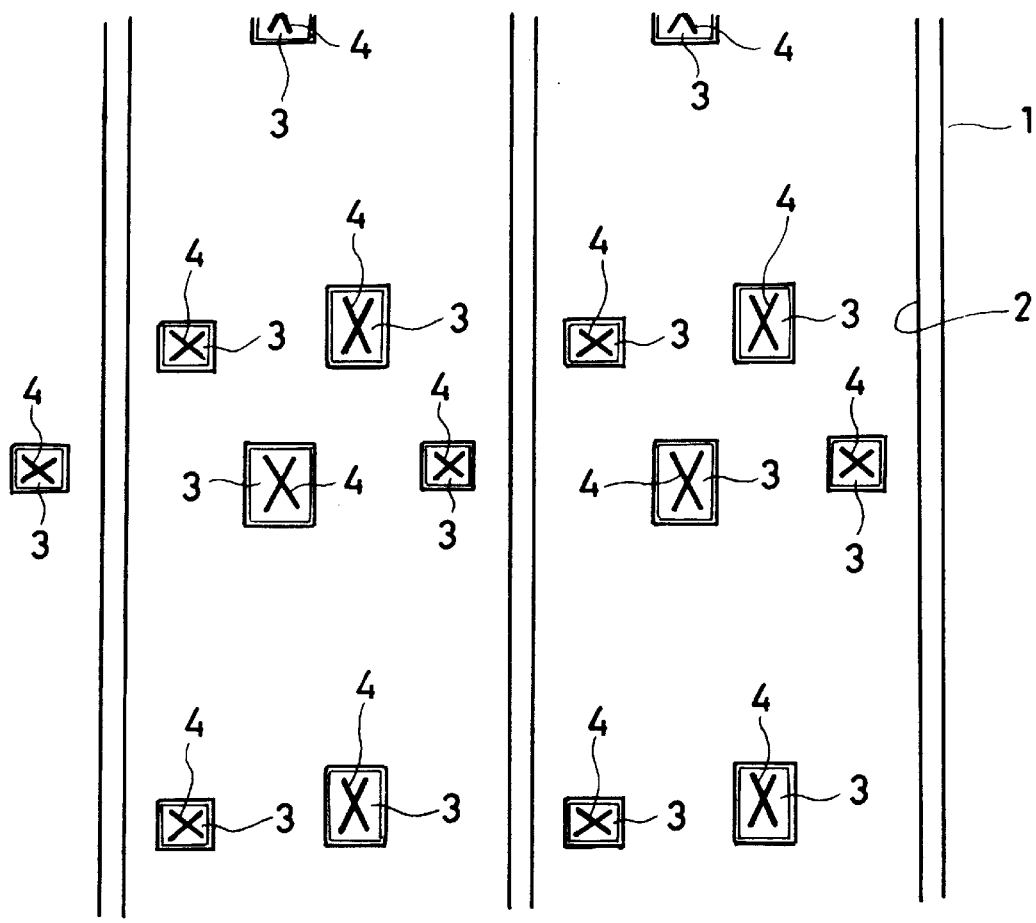
FIG. 3 is a partly enlarged view of a back surface side of the mask used in the present invention.
Figure 6:
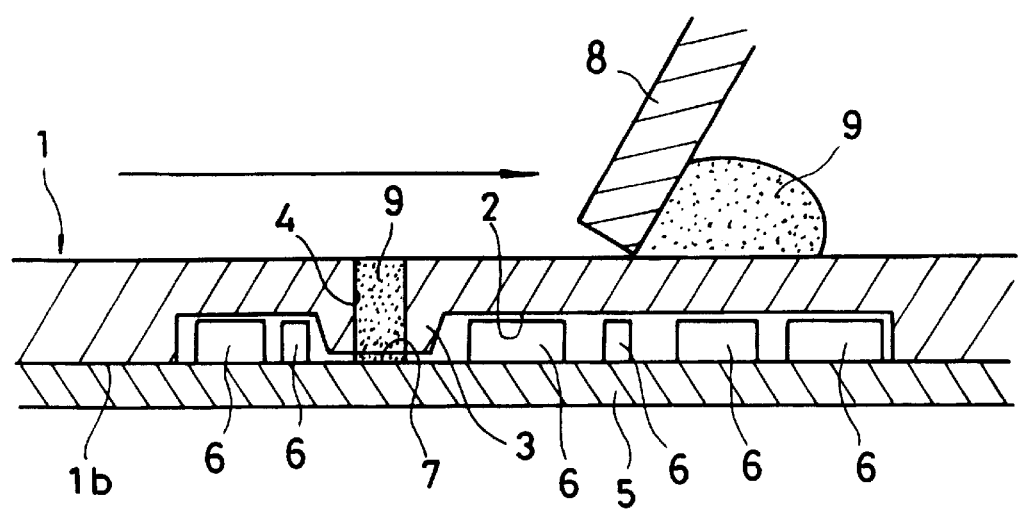
FIG. 6 is a schematic view for explaining the application process in accordance with the present invention.
Figure 4:
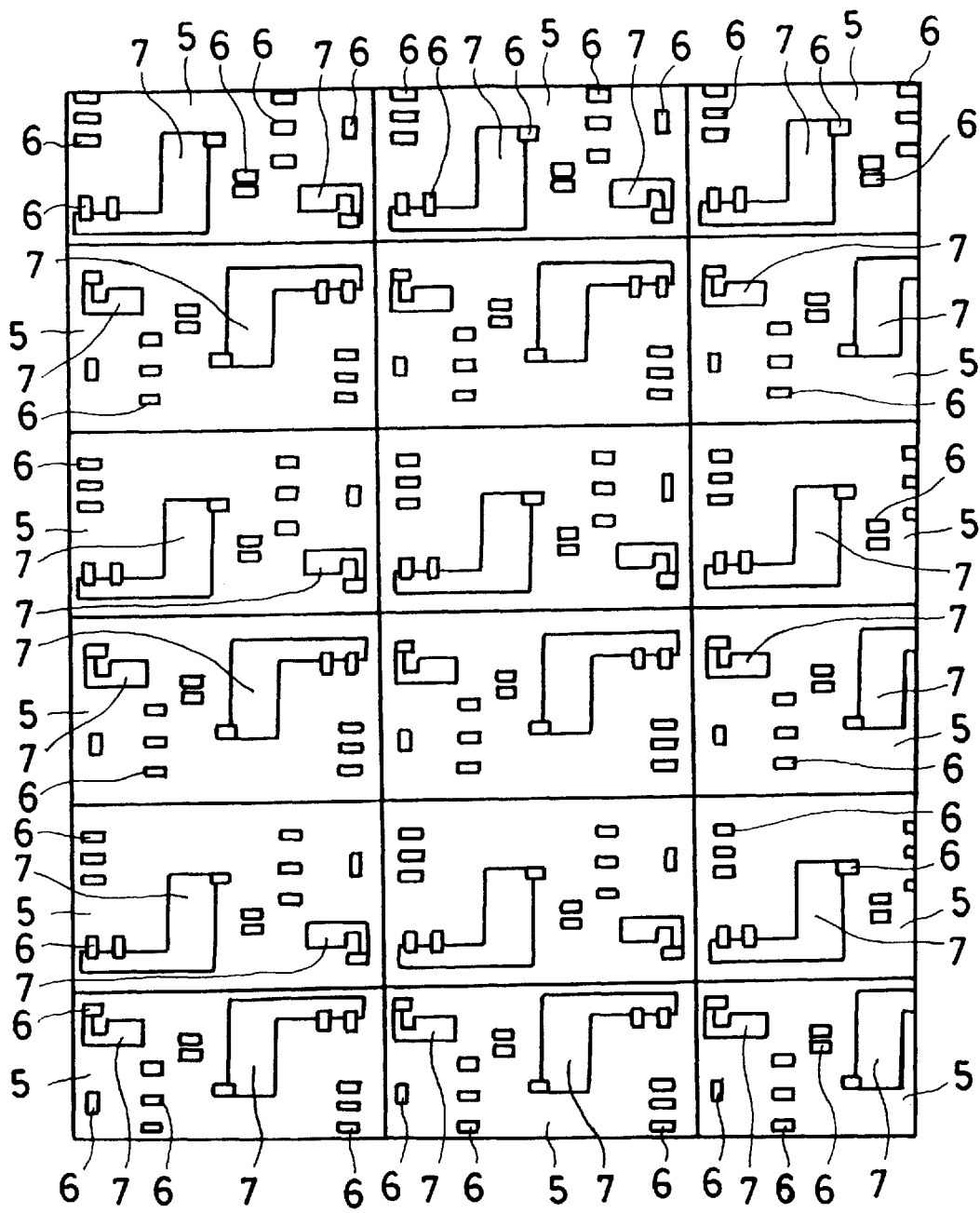
FIG. 4 is a schematic view for explaining an application process in accordance with the present invention.
Figure 5:
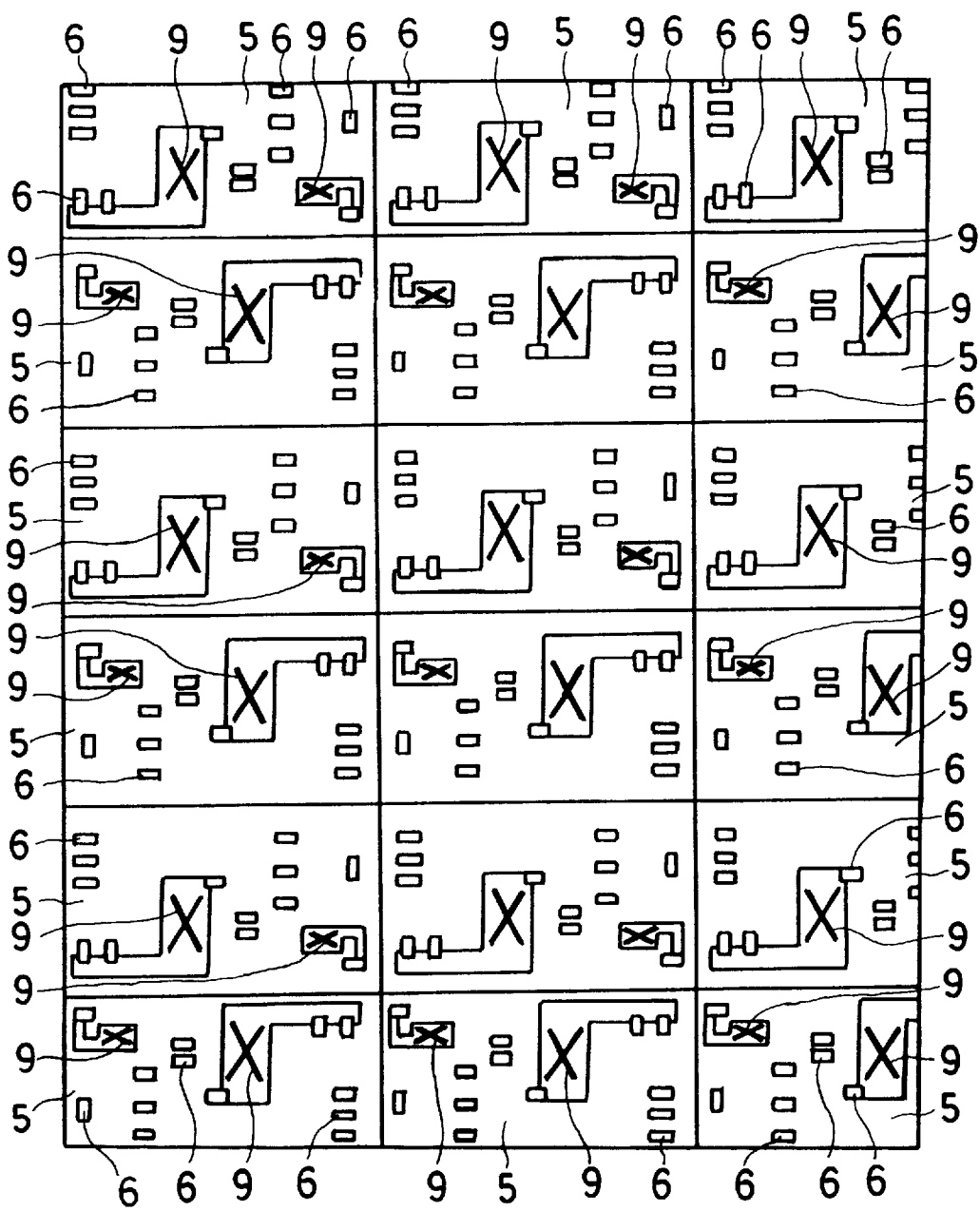
FIG. 5 is a schematic view for explaining the application process in accordance with the present invention.
Figure 7:
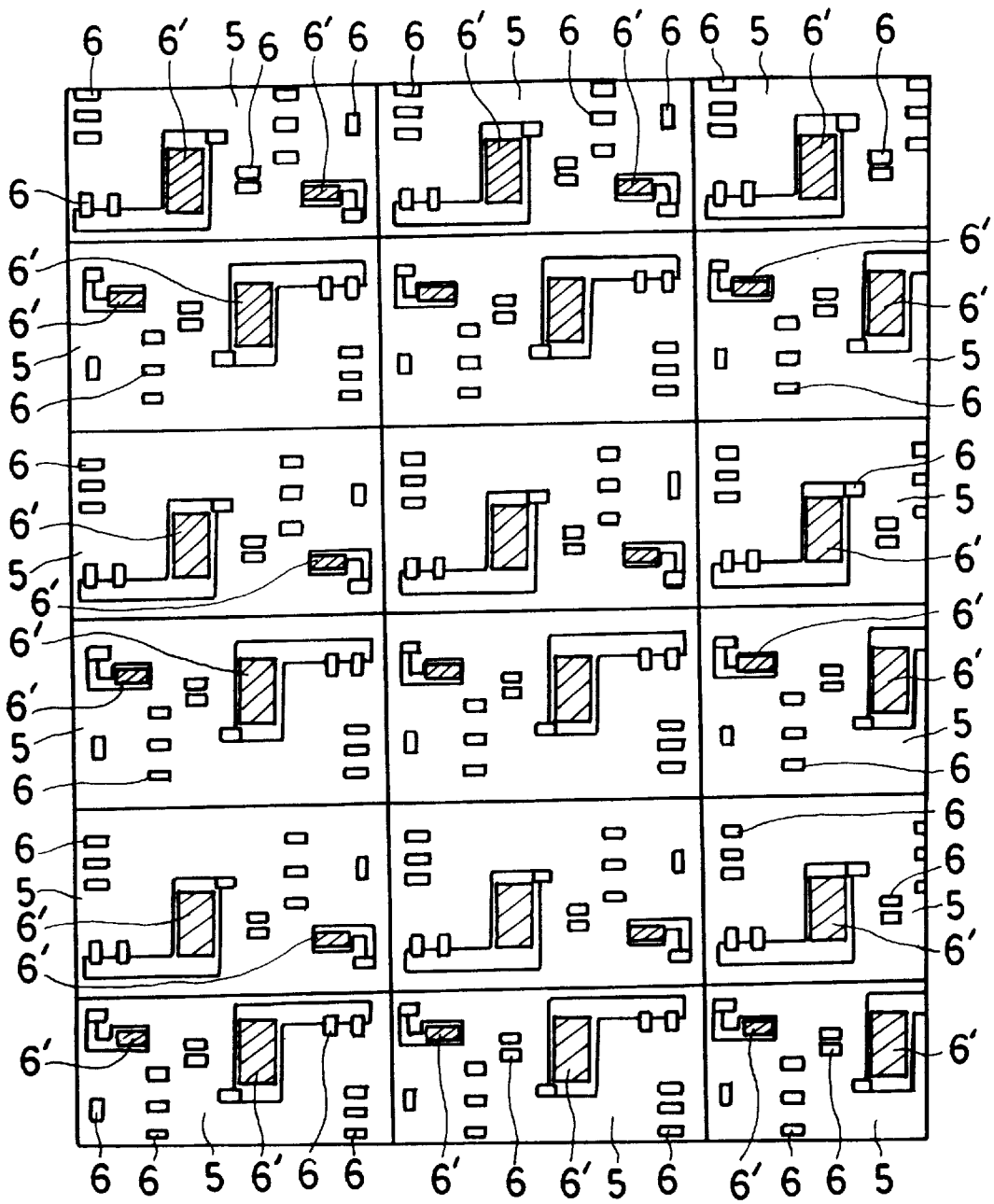
FIG. 7 is a schematic view of a front surface of the mask in a state of bonding and mounting the next part to an adhesive material.

FIG. 1 is a schematic view of a front surface of a mask used in the present invention, FIG. 2 is a schematic view of a back surface of the mask, FIG. 3 is a partly enlarged view of a back surface side of the mask, FIGS. 4 to 6 are schematic views for explaining an application process, and FIG. 7 is a schematic view of a front surface of the mask in a state of bonding and mounting the next part to an adhesive material.

In the drawings, reference numeral 1 denotes a mask used in the present invention, reference numeral 1a denotes a front surface of the mask and reference numeral 1b denotes a back surface of the mask. Further, the mask 1 is provided with a recess portion 2 surrounding a portion of the circuit board in which the parts are mounted, on the back surface 1b thereof, a portion corresponding to a position in the recess portion 2 at which the parts of the circuit board should be mounted is protruded, and a through hole 4 for applying an adhesive material is provided in the protruding portion 3.

Reference numeral 5 denotes a circuit board in a state of mounting parts 6. Reference numeral 7 denotes a position at which of the circuit board 5 the parts should be mounted.

Reference numeral 8 denotes a squeegee in a screen printing apparatus, and reference numeral 9 denotes an adhesive material.

In this case, in accordance with the present invention, as shown in FIG. 4, a large number of circuit boards 5 on which the parts 6 are already mounted are arranged and set, then as shown in FIG. 6, the mask 1 is mounted thereon and the adhesive material 9 is pressed out by the squeegee 8, thereby applying the adhesive material 9 from the through hole 4. FIG. 5 shows this state, the adhesive material 9 is applied in a spot manner to the position 7 in the circuit board 5 at which the parts should be mounted. Then, next parts 6' are mounted to the circuit board to which the adhesive material is applied, as shown in FIG. 7.

In accordance with the present invention, the adhesive material can be applied to a large number of parts mounted circuit board at one time, it is possible to solve a troublesomeness in the case of manually applying the adhesive material in a spot manner and it is possible to greatly improve an efficiency of a whole of the mounting process.

What is claimed is:

1. A method for use in the manufacture of circuit boards, comprising:

providing a plurality of circuit boards each having a plurality of parts mounted to a respective surface;

arranging said circuit boards in a predetermined array;

providing a mask having a plurality of recesses and a plurality of protrusions extending into said recesses, said mask further having a plurality of through holes extending through respective ones of said protrusions;

covering said array of said circuit boards with said mask so that said recesses surround the mounted parts of said circuit boards, said mounted parts extend into said recesses, and said protrusions extend towards respective ones of said circuit boards; and after the covering of said array of said circuit boards, forcing a flowable material through said through holes onto said circuit boards.

2. The method defined in claim 1 wherein said array is a rectangular array having multiple rows and multiple columns.

3. The method defined in claim 2 wherein said circuit boards have an identical arrangements of said mounted parts, said recesses being disposed in at least one rectangular array.

4. The method defined in claim 1 wherein said flowable material is an adhesive composition.

5. The method defined in claim 4, further comprising:

removing said mask from said array of said circuit boards after the forcing of said adhesive material onto said circuit boards;

attaching additional parts to said circuit boards via the adhesive material.

6. The method defined in claim 1 wherein said array of said circuit boards is covered with said mask so that said protrusions extend substantially to said respective ones of said circuit boards, whereby said flowable material is controllably deposited in predetermined locations on said circuit boards.

7. The method defined in claim 1 wherein the forcing of said flowable material through said through holes includes depositing an amount of said flowable material on said mask and applying a squeegee to the flowable material deposited on said mask.

* * * * *